United States Patent [19]
Robinson et al.

[11] Patent Number: 5,751,004
[45] Date of Patent: May 12, 1998

[54] PROJECTION RETICLE TRANSMISSION CONTROL FOR COULOMB INTERACTION ANALYSIS

[75] Inventors: Christopher Frederick Robinson, Hyde Park, N.Y.; Werner Stickel, Ridgefield, Conn.

[73] Assignee: International Business Machines Corporation, Armonk, N.Y.

[21] Appl. No.: 789,675

[22] Filed: Jan. 24, 1997

[51] Int. Cl.⁶ .................................................. H01J 37/09
[52] U.S. Cl. ................................ 250/492.23; 250/492.2
[58] Field of Search ........................... 250/492.23, 492.2

[56] References Cited

U.S. PATENT DOCUMENTS

| | | | |
|---|---|---|---|
| 4,998,020 | 3/1991 | Misaka et al. | 250/492.2 |
| 5,097,138 | 3/1992 | Wakabayashi et al. | 250/492.2 |
| 5,130,213 | 7/1992 | Berger et al. | 430/4 |
| 5,250,812 | 10/1993 | Murai et al. | 250/492.23 |
| 5,278,419 | 1/1994 | Takahashi et al. | 250/492.2 |
| 5,283,440 | 2/1994 | Sohda et al. | 250/492.2 |
| 5,334,282 | 8/1994 | Nakayama et al. | 156/643 |
| 5,432,314 | 7/1995 | Yamazaki et al. | 219/121.25 |
| 5,438,207 | 8/1995 | Itoh et al. | 250/492.23 |

*Primary Examiner*—Jack I. Berman
*Attorney, Agent, or Firm*—Scully, Scott, Murphy & Presser

[57] ABSTRACT

A method and system for studying the effect of electron-electron interaction in an electron beam writing system. First and second test reticles are provided that have different open areas. An electron beam is directed through the first test reticle to form a first pattern on a test surface, and the electron beam is then directed through the second test reticle to form a second pattern on a test surface. Because the open areas of the test reticles differ, the current of the electron beam is different when that beam passes through the first test reticle than when that beam passes through the second test reticle. The resolution of the first formed pattern is compared with the resolution of the second formed pattern to assess the effect of the different currents of the electron beam on the resolutions of the formed patterns.

18 Claims, 5 Drawing Sheets

1

PROJECTION RETICLE TRANSMISSION CONTROL FOR COULOMB INTERACTION ANALYSIS

BACKGROUND OF THE INVENTION

This invention generally relates to electron beam writing systems, and more specifically, to methods and apparatus for analyzing the Coulomb interaction in such systems.

Electron beam writing systems are used to make large scale integrated circuits. A principle advantage of these systems is that they may be used to manufacture extremely fine lines. For example, electron beam writing systems may be used to form lines having widths of less than 0.05 µm with an alignment tolerance of less than 0.02 µm.

In the operation of an electron beam writing system, an electron beam is generated and directed through one or more masks or reticles that shape the cross section of the beam into a desired pattern. The shaped beam is then directed onto a wafer to form, or write, a pattern on the wafer, and typically the cross-sectional pattern of the beam is transferred into an electron sensitive polymer layer on the top surface of the wafer. That pattern may be formed in one exposure of the wafer to the electron beam, a procedure referred to as "one shot."

Projection beam lithography is one specific type of electron beam writing, and a key concern in electron beam projection lithography is how the electron-electron Coulomb interaction in the electron beam column between the reticle and the target impacts the lithographic resolution. The effects of Coulomb interactions are divided into two types: i)space charge blurring and defocusing, and ii) stochastic interactions.

In the former effect, the individual nature of the charged particles is not considered, and only their electric repulsion is considered. The beam is treated as a stream of fluid. Since the repulsion is symmetric around the beam axis, it leads to an isotropic expansion of the beam, shifting the focus of any lens further downstream, and thereby blurring the image in a given focusing plane as well as changing the effective lens magnification. This effect can, in principle, be compensated by readjustment of, or refocusing, the lens, and therefore is ususally not considered a serious problem. In large field projection systems—that is, large in comparison to the minimum feature size—however, sequential projection of pattern sections noticably varying in density has to take the space charge blurring into account.

Stochastic interactions are due to the interference of individual particles with each other and are statistical in nature, and therefore are not compensable with a macroscopic action such as refocusing of a lens. These interactions lead to three types of effects corresponding to the three components of the Coulomb force, all eventually resulting in blurring the image. These interactions depend primarily on the total beam current, but also depend on the current distribution within the beam, if the beam is of a large width—that is, again, large in comparison to the minimum feature size. Stochastic interactions depend, as well, on the beam voltage, system length and the beam width itself.

Techniques are needed to investigate and to quantify the impact of Coulomb interactions on the resolution achievable with electron beam projection lithography.

SUMMARY OF THE INVENTION

An object of this invention is to investigate the resolution limits for projection beam lithography.

Another object of the present invention is to investigate stochastic Coulomb interaction in projection beam lithography.

Another object of this invention is to investigate space charge effects in projection beam lithography.

A further object of this invention is to provide a series of test reticles that may be used to investigate Coulomb interactions in projection beam lithography.

These and other objectives are attained with a method and system for studying the effect of electron-electron interaction in an electron beam writing system. First and second test reticles are provided that have different open areas. An electron beam is directed through the first test reticle to form a first pattern on a test surface means, and the electron beam is then directed through the second test reticle to form a second pattern on the test surface means. Because the open areas of the test reticles differ, the current of the electron beam is different when that beam passes through the first test reticle than when that beam passes through the second test reticle. The resolution of the first formed pattern is compared with the resolution of the second formed pattern to assess the effect of the different currents of the electron beam on the resolutions of the formed patterns.

For example, a first test reticle may incorporate a regular array of open areas of predetermined size; and as a more specific example, this test reticle may include a matrix of line space arrays placed at strategic locations throughout the exposure field, with those open areas providing a net transmission area of, for instance, 3.85%. In order to get data for comparison with theoretical modeling calculations, this pattern may be modified by providing it with additional, regular openings, to obtain reticles with transmission areas of, for instance, 23.85% and 43.85%.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENT

Figure 1:
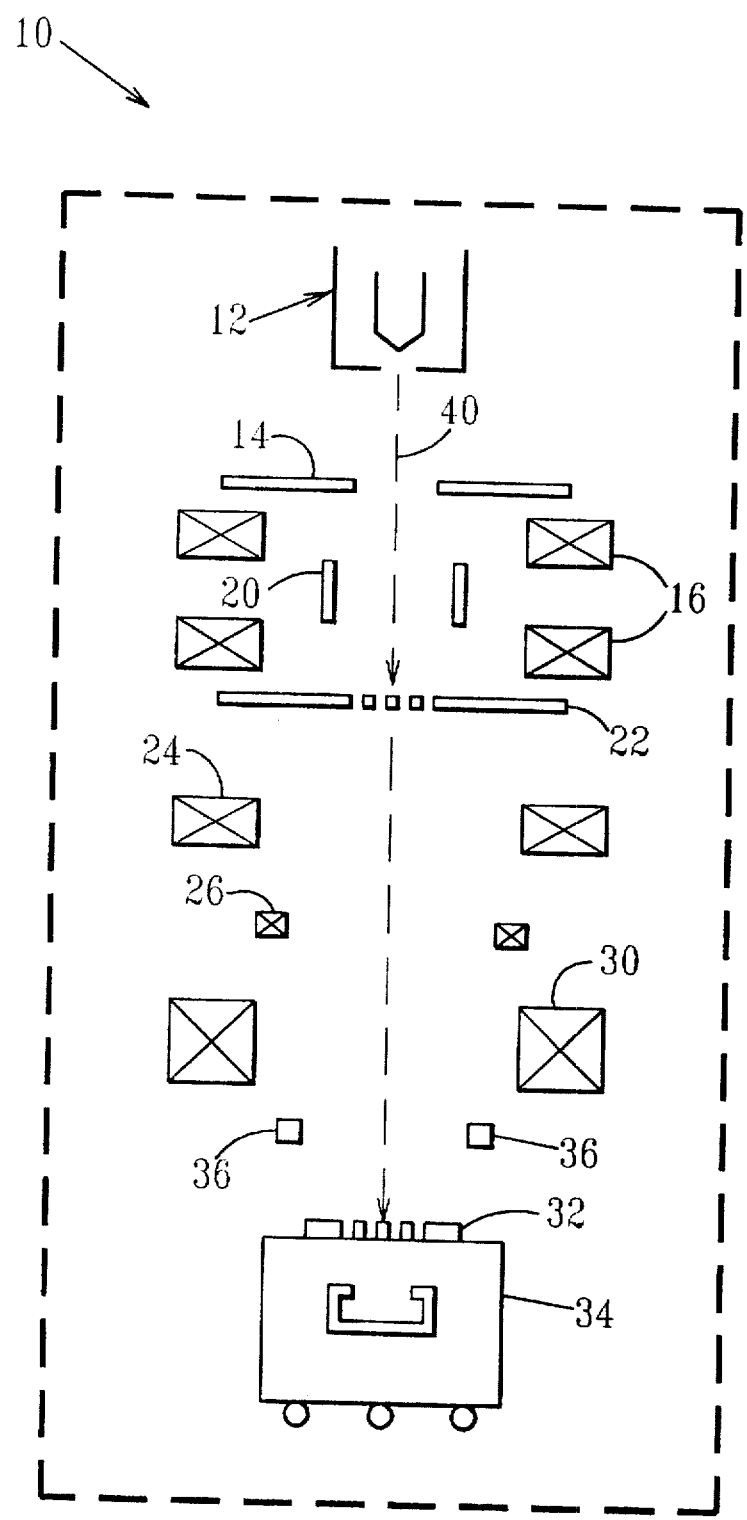
FIG. 1 illustrates an electron beam writing system.

FIG. 1 schematically illustrates an electron beam writing system 10 comprising electron gun 12, diaphragm 14, condenser and illumination lenses 16, deflection plates 20, reticle 22, reduction lens 24, rotation lens 26, objective lens 30, wafer 32, stage 34 and back scatter detectors 36. In this system, electron gun 12 emits electron beam 40 and directs that beam through diaphragm 14, which forms the beam into a particular cross-sectional shape. The shaped beam is then projected by lens 16 and plates 20 onto reticle 22, which further forms the cross-sectional shape of the beam.

Once the final shape of the beam is determined, reduction lens 24 may be used to reduce the size, or magnification, of the beam, and rotation and objective lenses 26 and 30 may be used to adjust the rotation and orthogonality of the beam. The beam 40 is then incident on wafer 32, which is supported by stage 34, and the beam forms a pattern on the resist coated wafer. Back scatter detectors 36 may be provided to detect and to generate signals representing the intensity of the electrons scattered upward from wafer 32.

Conventional or standard elements may be used in system 10. In addition, as will be understood by those of ordinary skill in the art, system 10 may be provided with additional or different elements depending on the intended use of the system.

The present invention relates to studying the effect of the electron-electron interaction in beam 40 and the resolution of the pattern formed by that beam. This is done by incorporating a regular array of open areas of predetermined size in a test reticle resolution pattern. First, the resolution test pattern is chosen and evaluated to assess the net transmission area, and examples of three test patterns are shown at 50, 52 and 54 in FIGS. 2, 3 and 4. Each of these patterns 50, 52 and 54 is comprised of a multitude of openings formed in a respective substrate or base material 56a, 56b and 56c. Each test reticle includes an array of subfields formed in the base or substrate material, and each of these subfields includes a multitude of groups of apertures that, when used in system 10, separate electron beam 40 into a multitude of component beams having various widths and spaced apart various distances.

Figure 2:
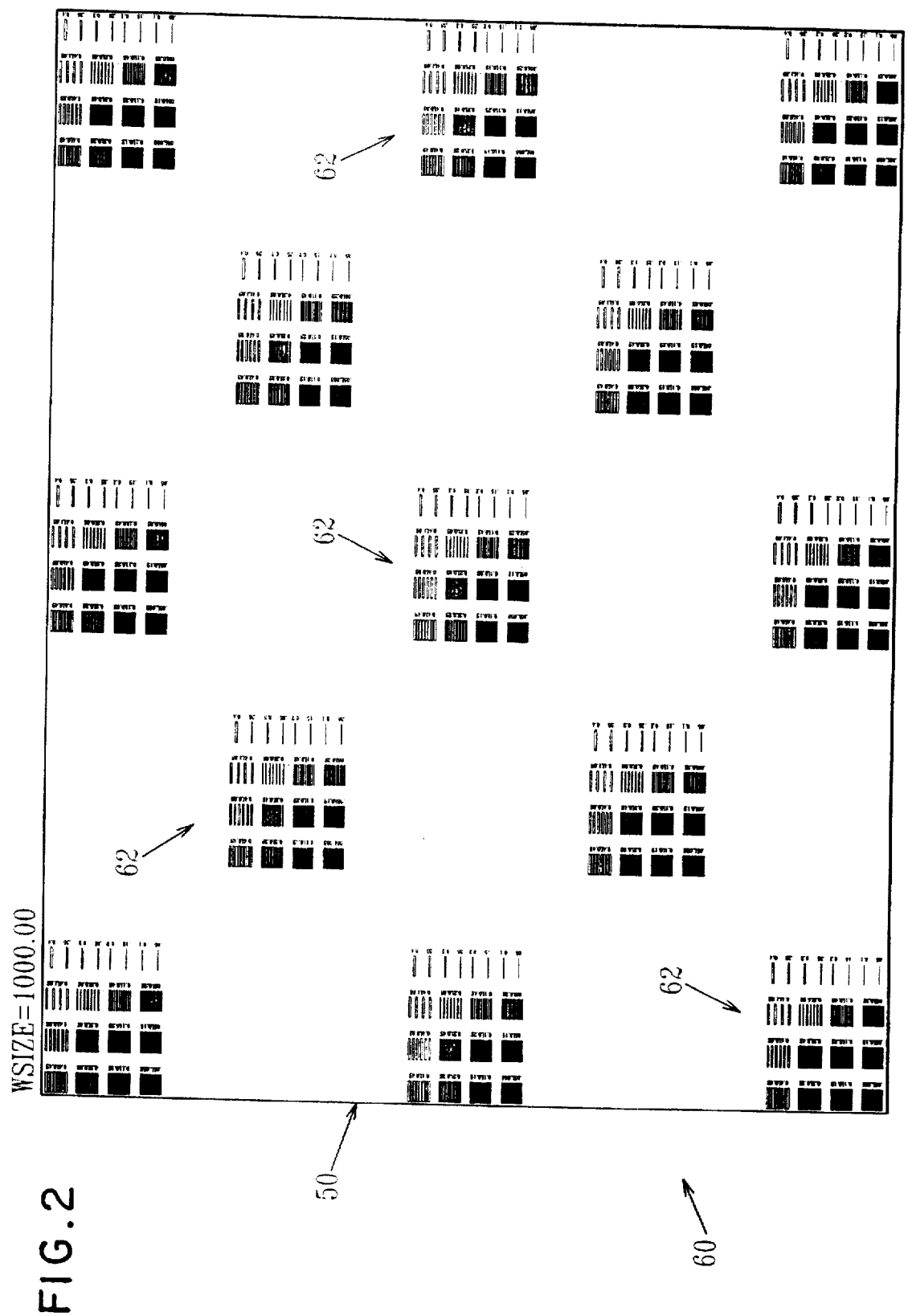
FIGS. 2, 3 and 4 show three different test reticles that may be used to study the electron-electron interaction in the electron beam of the system of FIG. 1.
Figure 3:
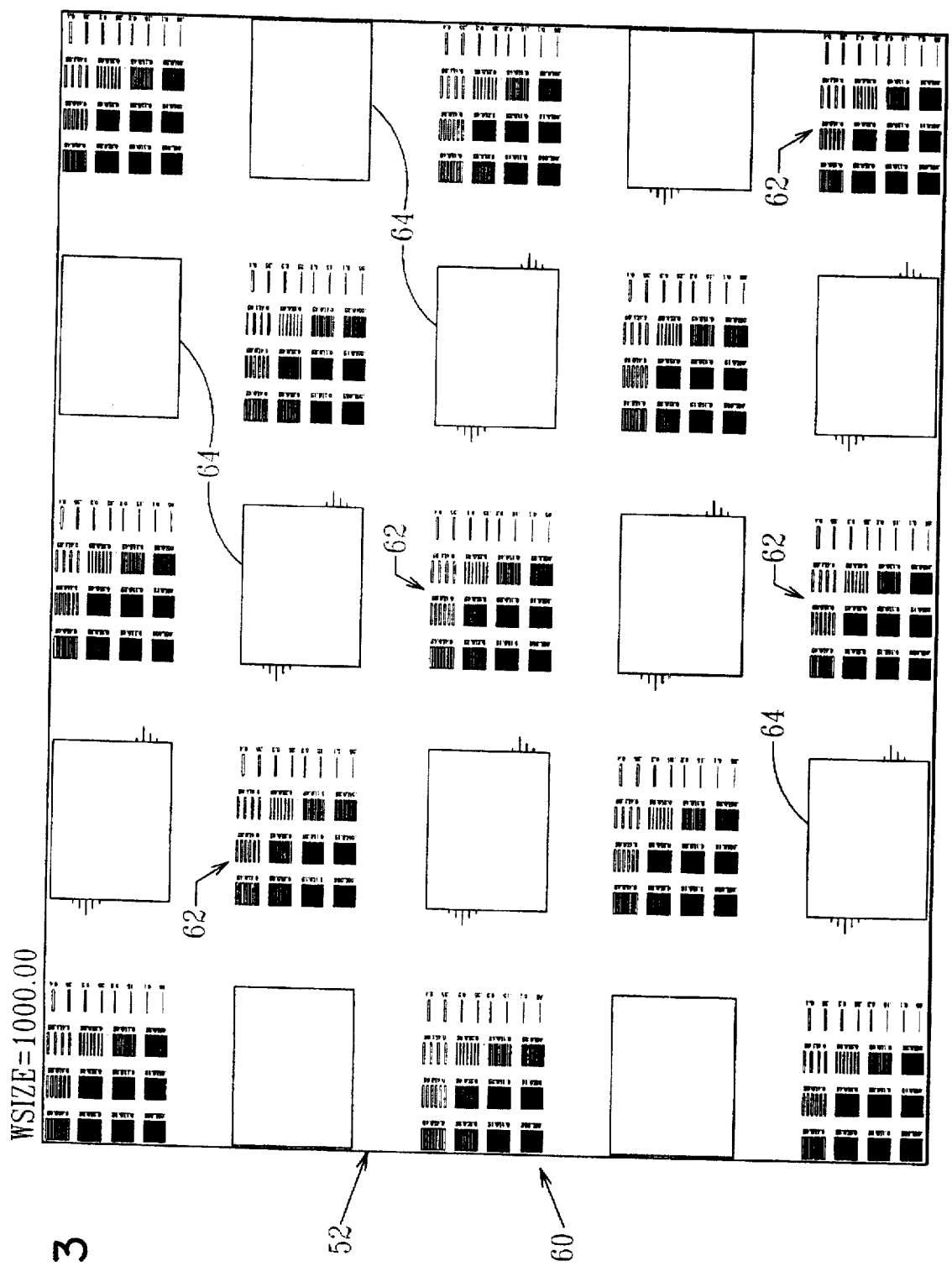
Figure 4:
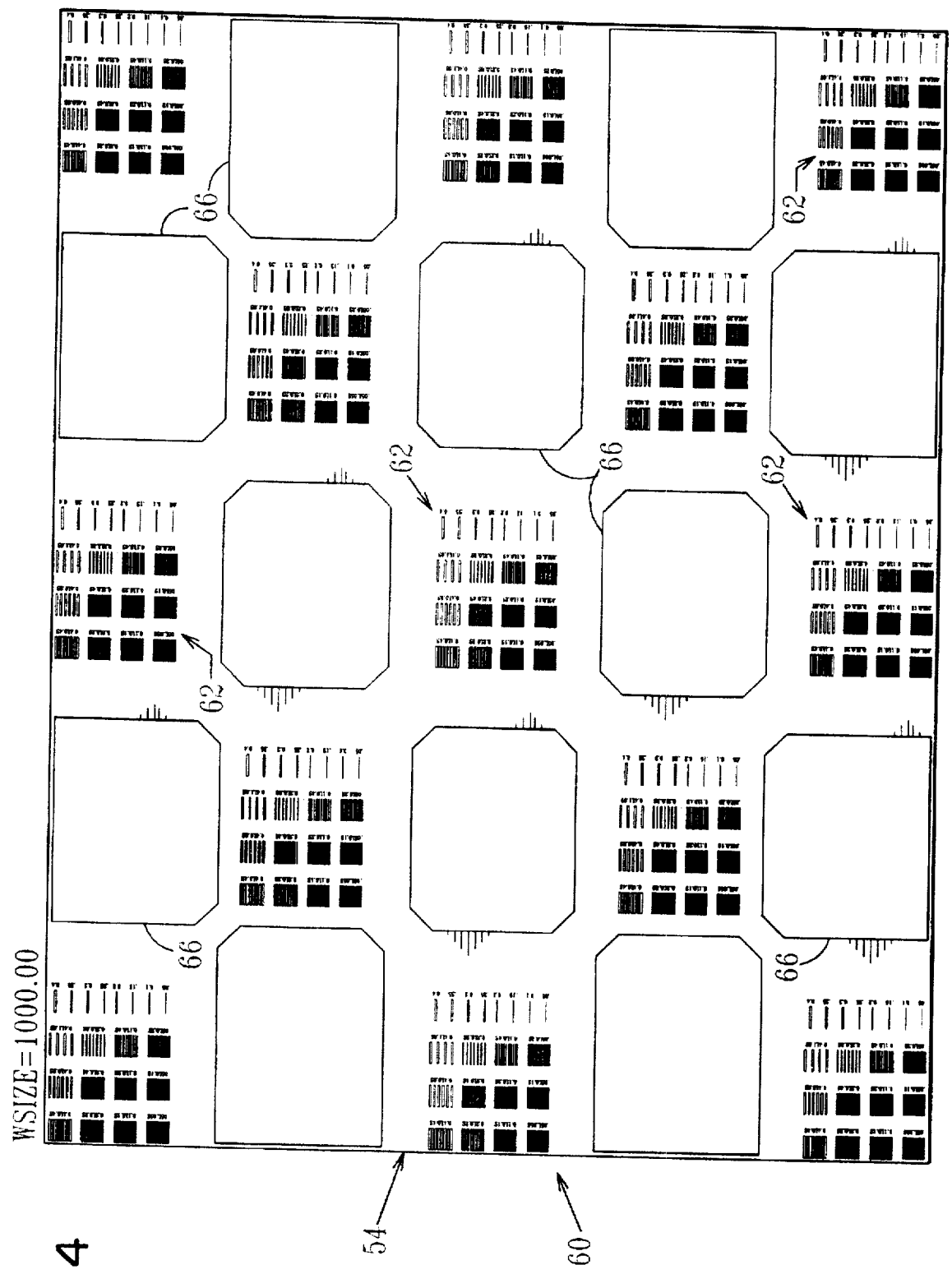

The pattern example 50 shown in FIG. 2 is a matrix 60 of line space arrays 62 placed at strategic locations throughout the exposure field. The net transmission area of this pattern is chosen to be as small as possible while still providing sufficient information on resolution. In the present example, the net transmission area of pattern 50 amounts to 3.85%. In order to obtain data for comparison with theoretical modeling calculations, this pattern may be modified to obtain versions with transmission areas of various sizes. For example, as shown in FIGS. 3 and 4, test reticles 52 and 54 may be provided with supplemental test blocks or openings 64 and 66, respectively, to obtain transmission areas of 23.85% and 43.85% respectively.

To study the effect of the electron-electron interaction on the resolution of the pattern formed by electron beam 40, two or more of the test reticles 50, 52 and 54 are substituted, one at a time, in system 10 for reticle 22. The electron beam is then directed through those test reticles, again one at a time, to form different patterns on a test surface means. This test surface means may be comprised of a single surface or more than one surface. Preferably, the different patterns are formed on the same wafer surface, adjacent to each other.

Because any two test reticles have different amounts or sizes of open areas, the number of electrons, and thus the currents, that pass through the two reticles when the two patterns are formed, are different—that is, a first current passes through the first test reticle when the first pattern is formed, and a second, different current passes through the second test reticle when the second pattern is formed.

After the two patterns are formed, conventional or standard procedures may then be used to measure or analyze the resolutions, and the difference between the resolutions, of the two formed patterns. The difference in the measured resolution of the two formed patterns can then be correlated to the difference in the two currents used to form the two patterns. By locally varying the pattern density of the test reticles, and thus the current transmitted through the test reticle, the transmitted current is altered with no adjustment of the electron gun 12. This significantly simplifies the measurement and also permits operation of the system under nominal conditions.

The additional openings 64, 66 of the test reticles 52, 54 may have various shapes and sizes, and these additional openings do not need to be smaller than or larger than the basic line space arrays 62. These additional openings may be arrays of small holes or lines with varying sizes and densities. Also, these additional openings may be evenly or unevenly distributed between the resolution patterns 62. Openings 64, 66 may be larger in one quadrant of the field than in another quadrant. An uneven distribution of the additional openings 64, 66 may better simulate circuit patterns with uneven density, such as in DRAMs at the rim of the memory array, and an uneven distribution of the additional openings may have an effect on the Coulomb interactions in large field projection systems.

The algorithm shown below enables one to design the pattern for the test reticle for any desired transmission area appropriate to the modeling conditions. The lower limit for net transmission area is set by the choice of resolution test pattern. The upper limit for the net transmission area is set by either the remaining open space available, or in the case of stencil masks, by the requirement to maintain the structural integrity of the reticle.

$a = (A/B) * (N-n)$ $L = \sqrt{a}$ where:

A=total test pattern area,
n=base resolution test pattern density,
N=desired net pattern density,
B=number of supplemental test blocks,
a=area of each supplemental block, and
L=length width of supplemental block.

For example, for $A = 1,000,000 \ \mu m^2$,
$B = 12$,
$N = 0.2385$, and
$n = 0.0385$, then $a = (1,000,000 \ \mu m^2 / 12) * (0.2385 - 0.0385) = 16,667 \ \mu m^2$ $L = \sqrt{16,667 \ \mu m^2} = 129.1 \ \mu m$ Thus, incorporating twelve 129.1 μm square open areas in the pattern brings the net pattern density (or electron transmission) up to 23.85%. As pictured in FIG. 4, it is sometimes desireable to clip the sharp corners of the supplemental blocks to improve the structural integrity of the pattern. This can be done so long as the net open area is kept equal to the value a, determined above (i.e., increase L accordingly).

Preferably, the subfields 62 of arrays 60 are identical to each other and are comprised of a regular array of openings or apertures; and, for example, in each of the subfields 62, the multitude of groups of apertures of the subfield may be arranged in a matrix having j rows and k columns. One of these subfields is shown in detail in FIG. 5; and as shown therein, subfield 62 includes a matrix of groups of slits. Other types of resolution patterns may be used to form subfields 62, however. For example, the openings in the test reticles may be dot matrices, crosses, angled shaped openings, such as L-shaped openings, or concentric circles.

Figure 5:
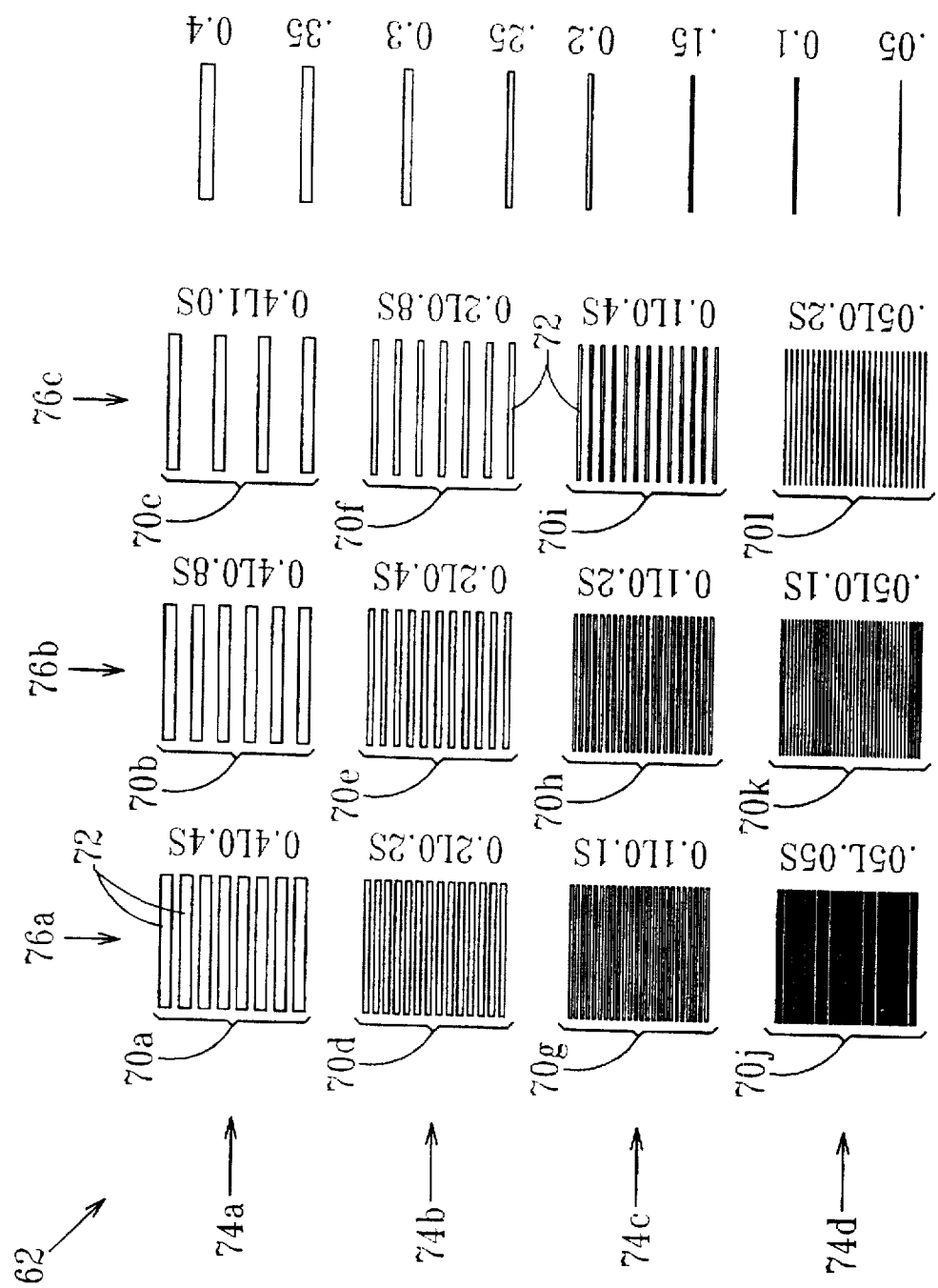
FIG. 5 is an enlarged view of one of the subfields of the test reticles.

With reference to the example shown in FIG. 5, subfield 62 includes a matrix of groups 70a–70l of the slits 72, with these groups arranged in a plurality of rows 74a, 74b, 74c and 74d and a plurality of columns 76a, 76b and 76c. For example, row 74a includes groups 70a, 70b and 70c; and row 74b includes groups 70d, 70e and 70f. Likewise, row 74c includes groups 70g, 70h and 70i; and row 74d includes groups 70j, 70k and 70l. Also, column 76a includes groups 70a, 70d, 70g and 70j ; column 76b includes groups 70b, 70e, 70h and 70k; and column 76c includes groups 70c, 70f, 70i and 70l.

In each of the rows, the slits 72 have substantially equal widths; however, the pitch of the slits varies from group to group. More specifically, for example, in row 74b the slits in groups 70d, 70e and 70f all have the same width; however, the slits are closer together—and thus have a finer pitch—in group 70d than in group 70e, and the slits are still closer together—and thus have an even finer pitch—in group 70f than in group 70e. Similarly, in row 74d, the slits all have the same width, which is different than the width of the slits in row 74b. Also, the slits in group 70g are closer together than in group 70h; and the slits of group 70i are still closer together than in group 70h.

Moreover, in each of the columns 76a, 76b and 76c, the widths and the pitch of the slits vary from group to group; and in particular, the widths of the slits decrease, and the pitch of the slits increase, in the downward direction as viewed in FIG. 5. More particularly, the pitch of the slits in group 70b is coarser than the pitch of the slits in group 70e. Likewise, the pitch of the slits in group 70e is coarser than in group 70h, and the pitch of the slits in group 70h is coarser than in group 70k.

As one example, the slits in groups 70a, 70b and 70c may have a width of 0.40 um; the slits in groups 70d, 70e and 70f may have a width of 0.20 um; the slits in groups 70g, 70h and 70i may have a width of 0.10 um; and the slits in groups 70j, 70k and 70l may have a width of 0.05 um.

While it is apparent that the invention herein disclosed is well calculated to fulfill the objects previously stated, it will be appreciated that numerous modification and embodiments may be devised by those skilled in the art, and it is intended that the appended claims cover all such modifications and embodiments as fall within the true spirit and scope of the present invention.

Having thus described our invention, what we claim as new, and desire to secure by letters patent is:

1. A method for studying the effect of electron-electron interaction in an electron beam writing system, comprising the steps of:

providing first and second test reticles, each of the test reticles having a pattern of openings, the openings of the first test reticle having a first total area, and the openings of the second test reticle having a second total area;

generating an electron beam;

directing the electron beam through the first test reticle and onto a test surface means to form a first pattern thereon, and directing the electron beam through the second test reticle and onto the test surface means to form a second pattern thereon, each of said formed patterns having a resolution, and wherein the electron beam forms a first current when directed through the first test reticle and a different, second current when directed through the second test reticle; and comparing the resolution of the first formed pattern with the resolution of the second formed patter to assess the effect of the currents of the electron beam on the resolutions of the formed patterns.

2. A method according to claim 1, wherein:

the pattern of openings of the first test reticle includes an array of subfields; and the pattern of openings of the second test reticle includes
i) an array of subfields, and
ii) an array of additional openings.

3. A method according to claim 2, wherein the array of subfields of the first and second test reticles are identical to each other.

4. A method according to claim 3, wherein each of said subfields includes a matrix of groups of slits.

5. A method according to claim 4, wherein in each of said matrices, the groups of slits of the matrix are arranged in a plurality of rows and a plurality of columns.

6. A method according to claim 5, wherein in each of said rows of groups of slits:

the slits of the row have substantially equal widths; and
the pitch of the slits varies from group to group.

7. A method according to claim 6, wherein in each of the columns of groups of slits, the pitch of the slits varies from group to group.

8. A method according to claim 4, wherein in each of the matrices, the slits of the matrix are substantially parallel to each other.

9. A system for studying the effect of electron-electron interaction in an electron beam lithography system, comprising:

a first test reticle having a pattern of openings having a first total area;

a second test reticle having a pattern of openings having a second total area different than the first total area;

test surface means;

means to generate an electron beam, to direct the beam through the first test reticle and onto the test surface means to form a first pattern thereon, and to direct the electron beam through the second test reticle and onto the test surface means to form a second test pattern thereon;

wherein the pattern of openings of the first test reticle includes an array of subfields; and the pattern of openings of the second test reticle includes (i) an array of subfields identical to the array of subfields of the first test reticle, and (ii) an array of additional openings;

whereby the electron beam forms a first current when directed through the first test reticle and a different, second current when directed through the second test reticle.

10. A system according to claim 9, wherein each of said subfields includes a matrix of groups of apertures.

11. A system according to claim 10, wherein:

in each of said matrices, the groups of apertures of the matrix are arranged in a plurality of rows and a plurality of columns;

in each of said rows of groups of apertures,
i) the apertures of the row have substantially equal widths; and
ii) the pitch of the apertures varies from group to group; and in each of the columns of groups of apertures, the pitch of the apertures varies from group to group.

12. A test reticle for studying the effect of electron-electron interaction in an electron beam, comprising:

a base; and an array of subfields formed in the base, each of the subfields including a multitude of groups of apertures to separate the electron beams into a multitude of component beams having various widths and spaced apart various distances.

13. A test reticle according to claim 12, wherein in each of the subfields, the multitude of groups of apertures of the subfield are arranged in a matrix having j rows and k columns.

14. A test reticle according to claim 13, wherein, in each row of groups of apertures in each subfield, the apertures of the row have equal widths, and the pitch of the apertures varies from group to group in the row of groups.

15. A test reticle according to claim 14, wherein, in each column of groups of apertures in each subfield, the widths of the apertures and the pitch of the apertures varies from group to group in the column.

16. A test reticle according to claim 12, further including an array of additional openings located between the subfields of apertures to increase the portion of the electron beam passing through the test reticle.

17. A test reticle according to claim 16, wherein the subfields of apertures and the array of additional openings are both unifomly arranged on the base in a manner to allow evaluation of resolution throughout the exposure field.

18. A test reticle according to claim 12, wherein the apertures are slits.

* * * * *

UNITED STATES PATENT AND TRADEMARK OFFICE
CERTIFICATE OF CORRECTION

PATENT NO. : 5,751,004
DATED      : May 12, 1998
INVENTOR(S) : Christopher F. Robinson, et al.

It is certified that error appears in the above-identified patent and that said Letters Patent is hereby corrected as shown below:

Column 5, line 56: "patter" should read --pattern--

Column 8, line 5, Claim 17: "unifomly" should read --uniformly--

Signed and Sealed this

Twenty-sixth Day of October, 1999

*Attest:*

Q. TODD DICKINSON

*Attesting Officer*     *Acting Commissioner of Patents and Trademarks*